(12) United States Patent
Pera (10) Patent No.: US 7,579,878 B2
(45) Date of Patent: Aug. 25, 2009

(54) HIGH GAIN, HIGH SPEED COMPARATOR OPERABLE AT LOW CURRENT

(75) Inventor: Florin Pera, Kanata (CA)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 101 days.

(21) Appl. No.: 11/514,121

(22) Filed: Aug. 31, 2006

(65) Prior Publication Data

US 2008/0054949 A1    Mar. 6, 2008

(51) Int. Cl.
*H03K 5/22* (2006.01)
(52) U.S. Cl. .............................. 327/65; 327/63; 327/66; 327/89; 330/252; 330/253
(58) Field of Classification Search ........................ None
See application file for complete search history.

(56) References Cited

U.S. PATENT DOCUMENTS

| | | | | |
|---|---|---|---|---|
| 4,987,379 A | * | 1/1991 | Hughes | 330/253 |
| 5,596,289 A | * | 1/1997 | Liu | 327/67 |
| 5,789,949 A | | 8/1998 | Giordano et al. | |
| 5,939,904 A | * | 8/1999 | Fetterman et al. | 327/67 |
| 5,990,708 A | * | 11/1999 | Hu | 327/68 |
| 6,049,229 A | * | 4/2000 | Manohar et al. | 326/83 |
| 6,118,318 A | * | 9/2000 | Fifield et al. | 327/206 |
| 6,549,049 B1 | * | 4/2003 | Hinterscher | 327/206 |
| 7,236,019 B2 | * | 6/2007 | Cowles et al. | 327/108 |
| 7,268,604 B2 | * | 9/2007 | Koo | 327/206 |
| 2009/0027086 A1 | * | 1/2009 | Trifonov | 327/66 |

FOREIGN PATENT DOCUMENTS

| | | |
|---|---|---|
| EP | 0 019 279 A | 11/1980 |
| EP | 0 334 220 A | 9/1989 |
| WO | WO 02/09275 A | 1/2002 |

* cited by examiner

*Primary Examiner*—Tuan Lam
*Assistant Examiner*—Hiep Nguyen
(74) *Attorney, Agent, or Firm*—RatnerPrestia (57) ABSTRACT

A comparator includes a differential pair of transistors providing a first amplification stage and receiving inverting and non-inverting input signals. An output transistor is coupled to the differential pair of transistors providing a second amplification stage and transitioning the output signal state when the non-inverting input signal is larger than the inverting input signal. The output node of one of the differential pair of transistors is connected to an input node of a current-tail transistor. The output node of the other differential transistor is connected to an input node of the output transistor. The other nodes of the differential pair of transistors are connected to each other and are coupled to an output node of the current-tail transistor. The output nodes of the differential pair of transistors and an output node of the output transistor are each coupled to a separate current generator that may include a complex impedance element.

8 Claims, 7 Drawing Sheets

HIGH GAIN, HIGH SPEED COMPARATOR OPERABLE AT LOW CURRENT

FIELD OF THE INVENTION

The present invention relates, in general, to a comparator. More specifically, the present invention relates to a high gain, high speed comparator that is operable with low current.

BACKGROUND OF THE INVENTION

A comparator may be implemented with an operational amplifier that compares two input voltages and provides an output signal to indicate which input voltage is larger. As an operational amplifier, a comparator has an inverting input terminal and a non-inverting input terminal. When the non-inverting input terminal is at a higher voltage than the inverting input terminal, the gain of the operational amplifier causes the output signal to become positive. When the voltage of the non-inverting input terminal drops below the voltage of the inverting input terminal, the is operational amplifier causes the output signal to drop towards a ground potential. Thus, a comparator is useful for a variety of functions, such as polarity identification, 1-bit analog-to-digital conversion, driving a switch, square/triangular-wave generation, and pulse-edge generation.

In order to compare small voltage differences at the input terminals, a comparator requires a high gain. The comparator must also have a high gain to provide a fast transition at the output terminal. This is because the output signal of the comparator does not change instantaneously but experiences a propagation delay from the time of arrival of the two input signals at the input terminals. In order to increase the gain, however, amplification stages are typically added to conventional comparators, thereby increasing current draw and propagation delay. A conventional comparator disadvantageously draws a higher current, when the input voltages are near the switching threshold of the comparator, i.e. when the difference between the input voltages is small.

Thus, there is a need for a comparator that has a high gain, high speed, and draws low current when comparing small voltage differences between input signals. The present invention addresses such a comparator.

SUMMARY OF THE INVENTION

To meet this and other needs, and in view of its purposes, the present invention provides a comparator including a differential pair of transistors for (a) providing a first stage of amplification and (b) receiving inverting and non-inverting input signals. Also included is an output transistor having a grounded node. The output transistor is coupled to the differential pair of transistors for (a) providing a second stage of amplification and (b) transitioning the output signal from one state to another state when the non-inverting input signal is larger than the inverting input signal.

The output node of one of the differential pair of transistors is connected to the input node of a current-tail transistor. The output node of the other differential transistor is connected to an input node of the output transistor. The input nodes of the differential pair of transistors receive the inverting and non-inverting input signals to the comparator. The other nodes of the differential pair of transistors are connected to each other and are coupled to an output node of the current-tail transistor.

The output nodes of the differential pair of transistors and an output node of the output transistor are each coupled to a separate current generator that includes a complex impedance element. These current generators may be implemented as a field effect transistor (FET), a bipolar transistor (BJT) or as passive complex impedance elements. The current generators may be biased by an externally supplied current or by a current flowing in an internal feedback transistor.

The current generators provide currents of i1 and i2 to the output nodes, respectively, of the differential pair of transistors, thus providing a current of i3 to the output node of the current-tail transistor. The current i3 is substantially equal to the sum of currents i1 and i2. The current generators also provide a current of i5 to the output node of the output transistor, and the current of i5 mirrors the current of i3.

Another embodiment of the present invention includes a feedback transistor that is coupled between the current-tail transistor and the differential pair of transistors for establishing the currents flowing in each of the differential pair of transistors. The input node of the feedback transistor is connected to the input node of the current-tail transistor. The output node of the feedback transistor is coupled to a separate current generator. Each current generator includes a field effect transistor (FET) coupled to each respective output node, and the FET is biased by the current flowing in the feedback transistor. Alternatively, each current generator includes a bipolar transistor (BJT) coupled to each respective output node, and the BJT is biased by the current flowing in the feedback transistor.

Yet another embodiment of the present invention is the differential pair of transistors including two similar FETs or two similar bipolar transistors, with the output transistor and the current-tail transistor including proportionally sized FETs or proportionally sized bipolar transistors. The current-tail transistor is configured to have a current flow that is substantially equal to the sum of the currents flowing in each of the differential pair of transistors. The output transistor is configured to have a current flow that is proportional to the current flowing in the current-tail transistor.

BRIEF DESCRIPTION OF THE DRAWING

The invention is best understood from the following detailed description when read in connection with the accompanying drawing. Included in the drawing are the following figures.

DETAILED DESCRIPTION OF THE INVENTION

As will be described, the present invention provides a comparator including a differential pair of transistors for (a) providing a first stage of amplification and (b) receiving inverting and non-inverting input signals. Also included is an output transistor having a grounded node. The output transistor is coupled to the differential pair of transistors for (a) providing a second stage of amplification and (b) transitioning the output signal from one state to another state when the non-inverting input signal is larger than the inverting input signal.

As will be explained, the output nodes of the differential pair of transistors and the output node of the output transistor are each coupled to a separate current generator. Each current generator provides a separate current source to feed each of the differential pair of transistors and the output transistor. As will also be described later, these current sources may be implemented with complex impedance elements which are connected directly to a power supply. In one embodiment of the present invention, these current sources may be implemented with field effect transistors (FETs), or with bipolar transistors (BJTs), which are biased by an externally provided current generator. In yet another embodiment, the FETs or the BJTs are biased by a current generated from an internally provided feedback transistor.

Figure 1:
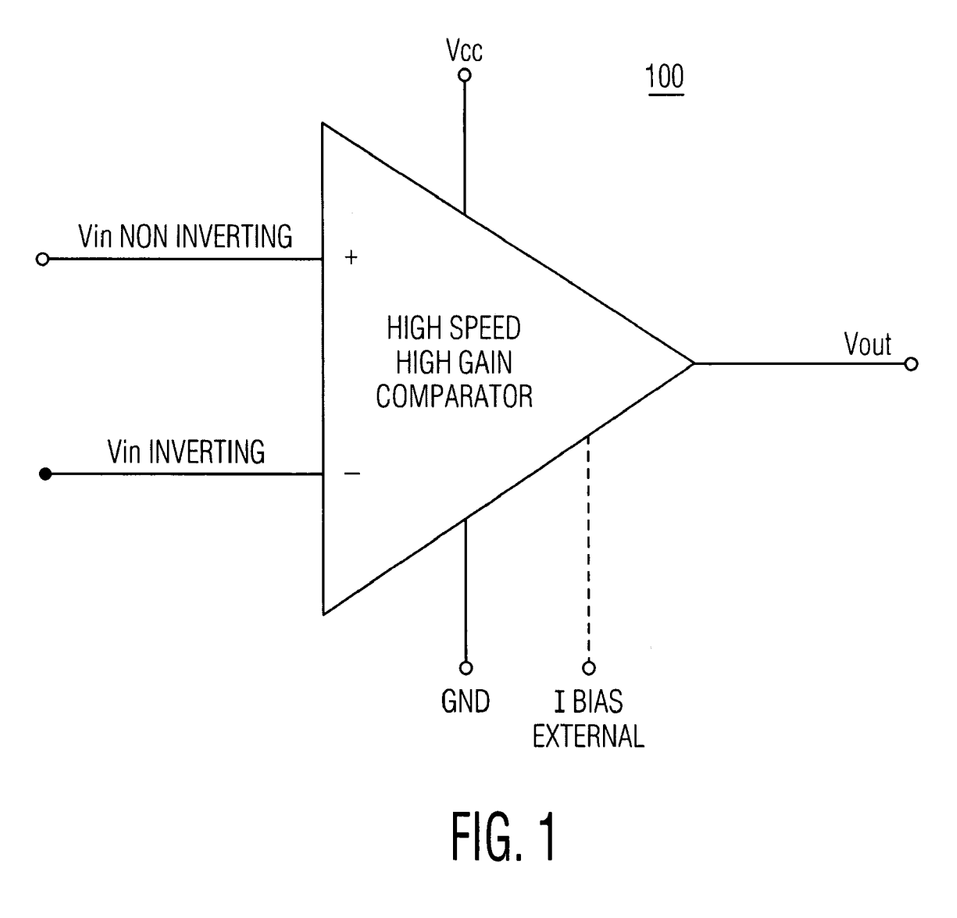
FIG. 1 is an upper level block diagram of a high gain, high speed comparator, in accordance with an embodiment of the present invention.

Referring first to FIG. 1, there is shown an upper level block diagram of a high gain, high speed comparator, the device generally referred to as 100. Comparator 100 includes two voltage input signals, shown as Vin inverting and Vin non-inverting. The comparator 100 also includes an output signal shown as Vout. The comparator 100 may optionally include a biasing control, shown as I-bias external. This biasing control will be described later. Lastly, as shown in FIG. 1, comparator 100 includes a VCC power supply input of nominally 1.5 volts (for example) and a ground potential.

Figure 2:
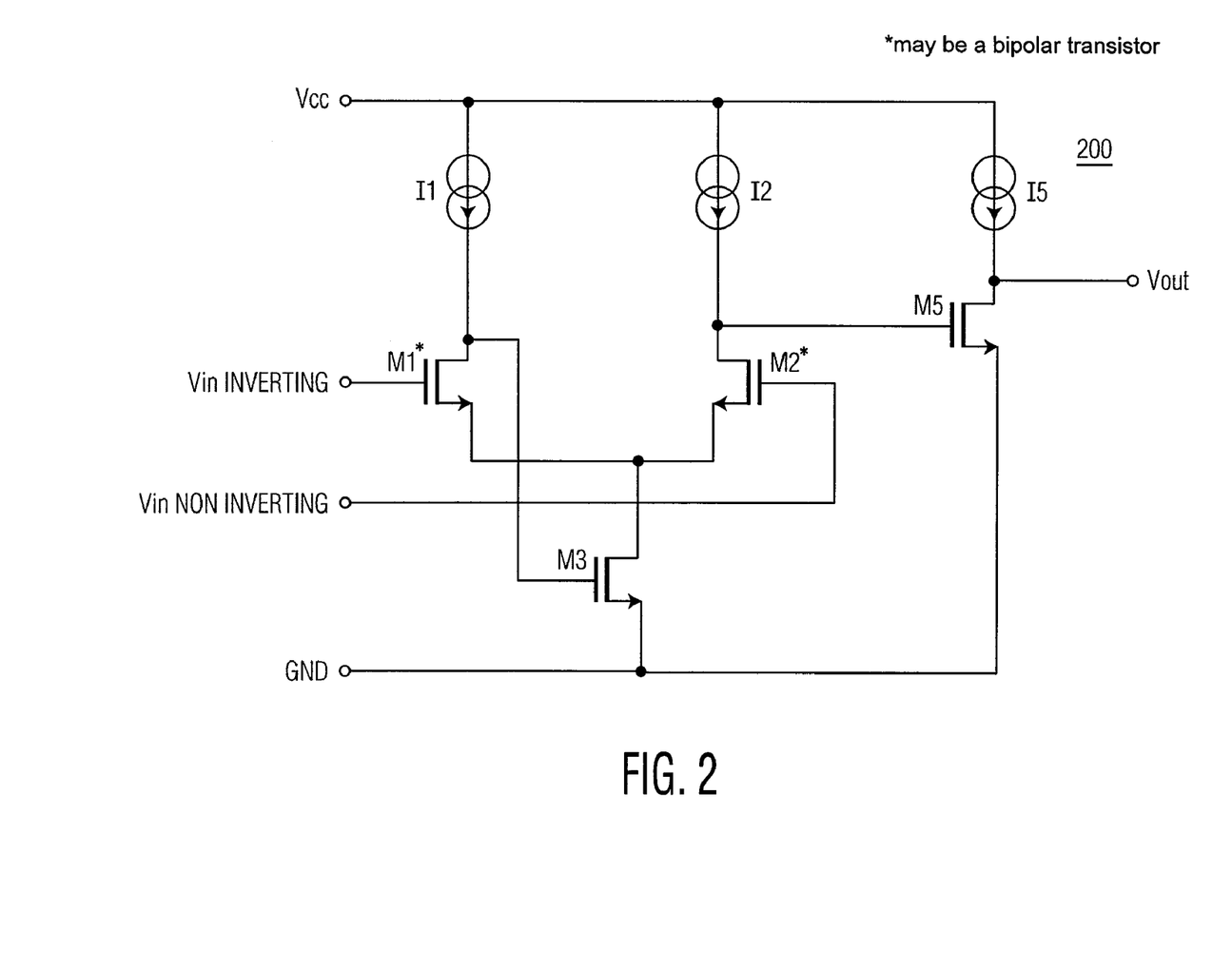
FIG. 2 is a schematic diagram of the high gain, high speed comparator of FIG. 1, in accordance with an embodiment of the present invention.

A schematic diagram of comparator 100 is shown in FIG. 2, in accordance with one embodiment of the present invention, in which the comparator is designated as 200. As shown, comparator 200 includes a differential pair of transistors, designated as M1 and M2. Comparator 200 also includes a current-tail transistor, designated as M3, and an output transistor designated as M5. Although these transistors are shown implemented with field effect transistors (FETs), it will be appreciated that comparator 200 may be implemented with bipolar transistors (BJTs). Comparator 200 further includes current sources, designated as I1, I2 and I5. The I1 current source provides current to flow into the drain of transistor M1, the I2 current source provides current to flow into the drain of transistor M2, and the I5 current source provides current to flow into the drain of transistor M5.

As shown, transistors M1 and M2 receive the inverting and non-inverting input signals of comparator 200, respectively. Together, transistors M1 and M2 provide a first stage of amplification for the comparator.

The input signals, Vin inverting and Vin non-inverting, are coupled to the gates of transistors M1 and M2, respectively. The drain of transistor M1 is coupled to current source I1. The drain of transistor M2 is coupled to current source I2. Current sources I1 and I2 are each coupled to the power supply voltage VCC. The sources of differential transistor pair M1 and M2 are connected together, and are also connected to the drain of current-tail transistor M3. The gate of current-tail transistor M3 is connected to the drain of transistor M1 and the source of current-tail transistor M3 is grounded.

The drain of transistor M2 is connected to the gate of output transistor M5. The drain of output transistor M5 is connected to current source I5. Current source I5 is also coupled to VCC. Output transistor M5 is connected in a common-source configuration, with its source connected to ground and with its drain providing the output, Vout, of comparator 200. In this manner, transistor M5 provides the second stage of amplification for comparator 200.

Figure 3:
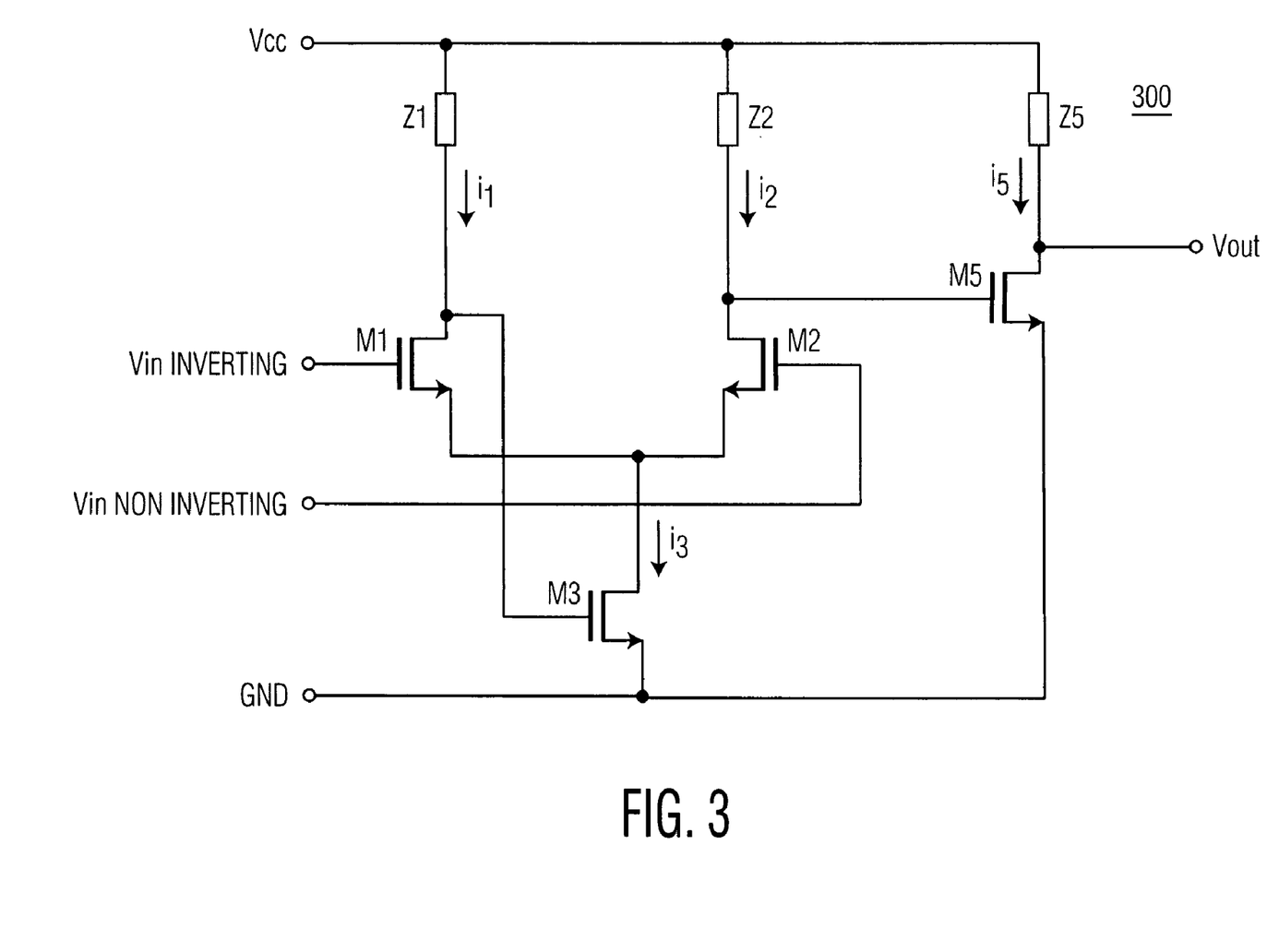
FIG. 3 is a schematic diagram of the high gain, high speed comparator with the current generators of FIG. 2 replaced with impedance elements, in accordance with another embodiment of the present invention.

Referring next to FIG. 3, there is shown a schematic diagram of one embodiment of comparator 200, in which the current sources shown in FIG. 2 are implemented with complex impedance elements. As shown, comparator 300 includes the differential pair of transistors M1 and M2, the current-tail transistor M3, the output transistor M5. Although these transistors are shown implemented with field effect transistors (FETs), it will be appreciated that comparator 300 may be implemented with bipolar transistors (BJTs). In the exemplary embodiment of FIG. 3, the current sources are implemented with complex impedance elements Z1, Z2 and Z5. These complex impedances may include some or all of the following elements: resistors, capacitors and inductors.

Referring to FIG. 3, the input signals, Vin inverting and Vin non-inverting, are coupled to the gates of transistors M1 and M2, respectively. The drain of transistor M1 is coupled to complex impedance element Z1. The drain of transistor M2 is coupled to complex impedance element Z2. Complex impedance elements Z1 and Z2 are each coupled to the power supply voltage VCC. The values of complex impedance elements Z1 and Z2 determine, respectively, current $i_1$ and current $i_2$. If element Z1 is equal to element Z2, current $i_1$ equals current $i_2$.

The sources of the differential transistor pair M1 and M2 in FIG. 3 are connected together, and are coupled to the drain of current-tail transistor M3. The gate of current-tail transistor M3 is coupled to the drain of transistor M1 and the source of current-tail transistor M3 is grounded. The drain of transistor M2 is connected to the gate of output transistor M5. The drain of output transistor M5 is coupled to complex impedance element Z5. Complex impedance element Z5 is also coupled to VCC. Output transistor M5 is connected in a common-source configuration, with its source connected to ground and with its drain providing the output, Vout, of comparator 300.

Figure 4:
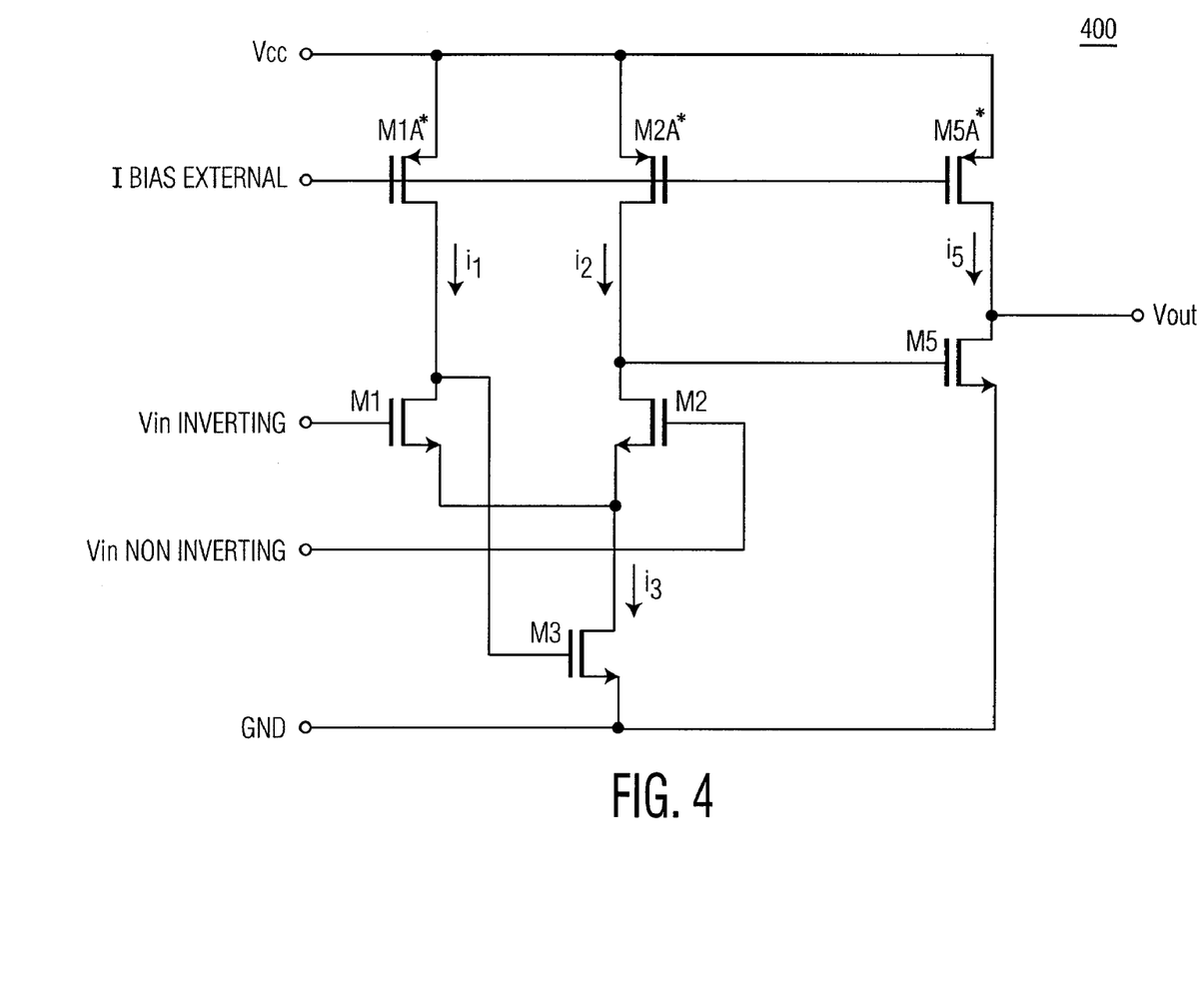
FIG. 4 is a schematic diagram of the high gain, high speed comparator with the current generators of FIG. 2 replaced with FET elements, in accordance with another embodiment of the present invention.

Referring next to FIG. 4, there is shown a schematic diagram of another embodiment of comparator 200, in which the current sources shown in FIG. 2 are implemented with field effect transistors (FETs). As shown, comparator 400 includes the differential pair of transistors M1 and M2, the current-tail transistor M3, and the output transistor M5. Although these transistors are shown implemented with field effect transistors (FETs), it will be appreciated that comparator 400 may be implemented with bipolar transistors (BJTs). In the exemplary embodiment of FIG. 4, the current sources are implemented with bias transistors M1A, M2A and M5A.

Still referring to FIG. 4, the input signals, Vin inverting and Vin non-inverting, are coupled to the gates of transistors M1 and M2, respectively. The drain of transistor M1 is coupled to the drain of bias transistor M1A. The drain of M2 is coupled to the drain of bias transistor M2A. The drain of M5 is coupled to the drain of bias transistor M5A. The source of each bias transistor M1A, M2A and M5A is coupled to the power supply voltage VCC. The gates of bias transistors M1A, M2A and M5A are connected together and coupled to an external terminal for providing the I-bias external signal.

The sources of the differential transistor pair M1 and M2 are connected together, and are coupled to the drain of current-tail transistor M3. The gate of current-tail transistor M3 is coupled to the drain of transistor M1 and the source of current-tail transistor M3 is grounded. The drain of transistor M2 is connected to the gate of output transistor M5. Output transistor M5 is connected in a common-source configuration, with its source connected to ground and with its drain providing the output, Vout, of comparator 400.

In the exemplary embodiment of FIG. 4, transistors M1, M2, M3 and M5 are shown implemented using NMOS transistors. It will be appreciated that these transistors may also be implemented using NPN bipolar transistors. The transistors M1A, M2A and M5A are shown implemented using PMOS transistors. It will be appreciated that these transistors may also be implemented using PNP bipolar transistors.

In operation, bias transistors M1A and M2A, respectively, supply the currents $i_1$ and $i_2$ which flow, respectively, through differential transistor pair M1 and M2. The current $i_3$ flowing through current-tail transistor M3 is equal to the sum of current $i_1$ and current $i_2$ flowing through the differential transistor pair M1 and M2. The amount of drain current that bias transistors M1A and M2A can supply is determined by the I-bias external control signal. Similarly, bias transistor M5A supplies the current $i_5$ and the amount of drain current that bias transistor M5A can supply is determined by the I-bias external control signal.

When the Vin non-inverting input signal is at a higher voltage than the Vin inverting input signal, transistor M2 has a higher gate to source voltage (Vgs) than transistor M1. Thus, transistor M2 is more saturated than transistor M1, and as a result, current $i_2$ is greater than current $i_1$. Current $i_3$ is equal to the sum of currents $i_1$ and $i_2$. Since transistor M1 is less saturated than transistor M2, the drain to source voltage (Vds) of transistor M1 increases, and, therefore, the gate to source voltage (Vgs) of current-tail transistor M3 increases.

As transistors. M2 and M3 become more saturated, the gate to source voltage (Vgs) of output transistor M5 is reduced. Output transistor M5 conducts less current due to the reduction in the Vgs, thereby causing current $i_5$ to establish a positive voltage at the node that provides the Vout signal. Accordingly, when the Vin non-inverting input signal is at a higher voltage than the Vin inverting input signal, the output signal Vout of comparator 400 becomes a positive voltage.

Conversely, when the Vin inverting input signal is at a higher voltage than the Vin non-inverting input signal, transistor M1 has a higher gate to source voltage (Vgs) than transistor M2. Thus, transistor M1 conducts in a region that is more saturated than the region of conductance of transistor M2. As a result, current $i_1$ becomes greater than current $i_2$. Current $i_3$ is equal to the sum of currents $i_1$ and $i_2$ As transistor M2 becomes less saturated and conducts less current, the gate to source voltage (Vgs) of output transistor M5 increases. Output transistor M5 conducts more current due to the higher Vgs, thereby causing current $i_5$ to be conducted through output transistor M5. Operationally, current $i_5$ is substantially conducted through output transistor M5, such that there is no current flow out of the Vout terminal of comparator 400. Thus, output transistor M5 is saturated, and the node of transistor M5 that provides the Vout signal is substantially grounded. Accordingly, when the Vin inverting input signal is at a higher voltage than the Vin non-inverting input signal, the output signal Vout of comparator 400 is substantially at zero voltage.

Figure 5:
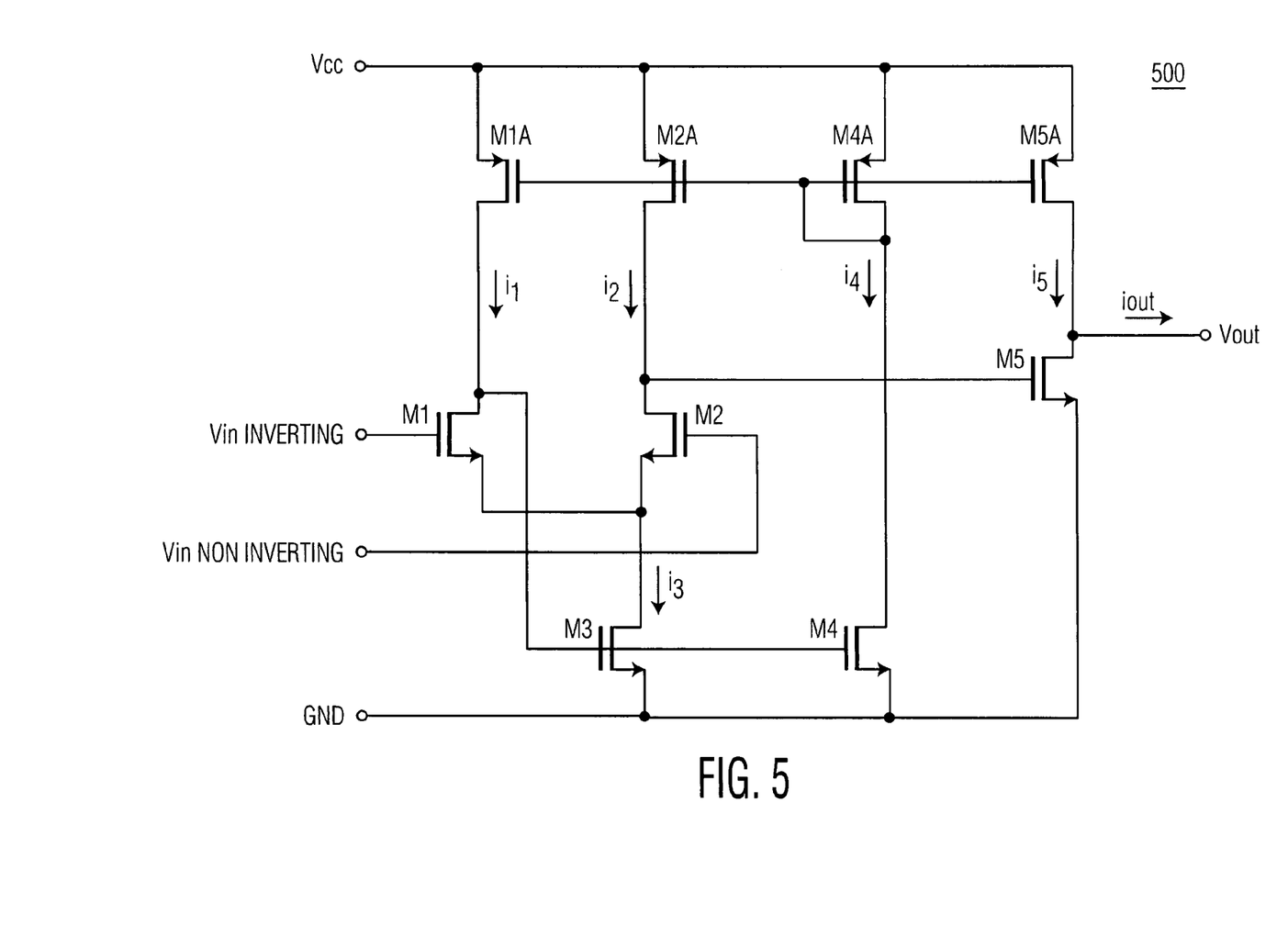
FIG. 5 is a schematic diagram of another embodiment of the high gain, high speed comparator of FIG. 1.

Referring next to FIG. 5, there is shown a schematic diagram of yet another exemplary embodiment of a comparator, designated as 500. As shown, comparator 500 includes the differential pair of transistors M1 and M2, the current-tail transistor M3, and the output transistor M5. Although these transistors are shown implemented with field effect transistors (FETs), it will be appreciated that these transistors may also be implemented with bipolar transistors (BJTs). The current sources are implemented with transistors M1A, M2A and M5A. In the shown embodiment, there is also included a feedback transistor M4, which has its own bias transistor M4A.

Except for the feedback transistor and its current source, the connections of the components comprising comparator 500 are similar to the connections of the components comprising comparator 200, 300, or 400. Accordingly, the input signals Vin inverting and Vin non-inverting are coupled to the gates of transistors M1 and M2, respectively. The drain of transistor M1 is coupled to the drain of bias transistor M1A. The drain of M2 is coupled to the drain of bias transistor M2A. The source of each of the bias transistors M1A, M2A and M5A is coupled to the power supply voltage VCC. The sources of the differential transistor pair M1 and M2 are connected together, and also coupled to the drain of current-tail transistor M3. The gate of current-tail transistor M3 is coupled to the drain of transistor M1 and the source of current-tail transistor M3 is grounded. The drain of transistor M2 is connected to the gate of output transistor M5. The drain of output transistor M5 is coupled to the drain of bias transistor M5A. Output transistor M5 is connected in a common-source configuration, with its source connected to ground and with its drain providing the output, Vout, of comparator 500.

As shown in FIG. 5, the gate of each of the bias transistors M1A, M2A and M5A are connected together and coupled for bias control by feedback transistor M4 and its current source transistor M4A. Thus, the control signal I-bias external shown in FIG. 4 is replaced in FIG. 5 by the internal feedback loop of feedback transistor M4 and feedback bias transistor M4A. The drain of feedback transistor M4 is connected to the drain of bias transistor M4A. The source of feedback transistor M4 is grounded. The source of bias transistor M4A is connected to the power supply voltage VCC. The gate of feedback transistor M4 is coupled to the gate of current-tail transistor M3, and the gate of feedback bias transistor M4A is coupled to the gate of each bias transistor M1A, M2A and M5A. Furthermore, the gate and drain of feedback bias transistor M4A are coupled to each other forming a connected node, and permitting feedback transistor M4 to control the gate voltages of each of the bias transistors M1A, M2A, M4A and M5A.

In the exemplary embodiment of FIG. 5, transistors M1, M2, M3, M4 and M5 are shown implemented using NMOS transistors. It will be appreciated that these transistors may also be implemented using NPN bipolar transistors. The transistors M1A, M2A, M4A and M5A are shown implemented using PMOS transistor. It will be appreciated that these transistors may also be implemented using PNP bipolar transistors.

In operation, the current $i_3$ flowing through the current-tail transistor M3 is substantially equal to the sum of current $i_1$ and current $i_2$ flowing through the differential transistor pair M1 and M2. Bias transistors M1A and M2A, respectively, supply the currents $i_1$ and $i_2$. The drain current that bias transistors M1A and M2A can supply is determined by feedback transistor M4 and feedback bias transistor M4A, which will be described later. Similarly, bias transistor M5A supplies the current $i_5$, whose level is also determined by feedback transistor M4 and feedback bias transistor M4A.

When the Vin non-inverting input signal is at a higher voltage than the Vin inverting input signal, transistor M2 has a higher gate to source voltage (Vgs) than transistor M1. Thus, transistor M2 is more saturated than transistor M1, and as a result, current $i_2$ is greater than current $i_1$. Current $i_3$ is equal to the sum of currents $i_1$ and $i_2$. Since transistor M1 is less saturated than transistor M2, the drain to source voltage (Vds) of transistor M1 increases and, therefore, the gate to source voltages (Vgs) of both current-tail transistor M3 and feedback transistor M4 also increase.

Due to the connection between the gate of current-tail transistor M3 and the gate of feedback transistor M4, the gate to source voltage (Vgs) of M4 is substantially equal to the gate to source voltage (Vgs) of current-tail transistor M3. Furthermore, the relationship between currents $i_3$ and $i_4$ is based upon the relationship between the physical sizes of transistors M3 and M4 and, accordingly, bias current $i_4$ substantially mirrors current $i_3$. When the size of transistor M3 is N times the size of transistor M4, current $i_3$ is equal to N times current $i_4$. When current-tail transistor M3 and feedback transistor M4 are of the same physical size, current $i_4$ is substantially equal to current $i_3$, which is substantially equal to the sum of current $i_1$ and current $i_2$ As the gate to source voltage (Vgs) of feedback transistor M4 increases, feedback transistor M4 is increasingly saturated, and the connected node of the drain and gate of feedback bias transistor M4A becomes substantially grounded. Thus, the gate of each bias transistor M1A, M2A, M4A and M5A is also substantially grounded. This creates a highly negative gate to source voltage (Vgs) on each of the bias transistors. Because each bias transistor is a PMOS transistor, as shown in FIG. 5, the highly negative gate to source voltage (Vgs) pushes each bias transistor into saturation, and increases currents $i_1$, $i_2$, $i_4$ and $i_5$.

As transistors M2 and M3 become more saturated, the gate to source voltage (Vgs) of output transistor M5 is reduced. Output transistor M5 conducts less current due to this lower gate to source voltage (Vgs) causing current $i_5$ to establish a positive voltage at the node as the Vout signal. Due to feedback transistor M4 being in saturation, output bias transistor M5A is also in saturation, and current i5 is at its maximum. When output transistor M5 is no longer saturated, the voltage present at the Vout terminal increases very quickly. Therefore, when the Vin non-inverting input signal is at a higher voltage than the Vin inverting input signal, the output signal Vout of comparator 500 becomes a positive voltage.

Conversely, when the Vin inverting input signal is at a higher voltage than the Vin non-inverting input signal, transistor M1 has a higher gate to source voltage (Vgs) than transistor M2. Thus, transistor M1 becomes more conducting than transistor M2, and as a result, current $i_1$ becomes greater than current $i_2$. Current $i_3$ is equal to the sum of currents $i_1$ and $i_2$. As transistor M1 becomes more saturated, the drain to source voltage (Vds) of transistor M1 decreases, and the gate to source voltages (Vgs) of both current-tail transistor M3 and feedback transistor M4 also decrease.

As the gate to source voltage (Vgs) of feedback transistor M4 decreases, feedback transistor M4 becomes less saturated, and the voltage of the connected node of the drain and gate of feedback bias transistor M4A becomes more positive. Thus, the gate of each bias transistor M1A, M2A, M4A and M5A has a positive voltage, which reduces the magnitude of the gate to source voltage (Vgs) on each of the bias transistors. Because each bias transistor is a PMOS transistor, as shown in FIG. 5, the reduction in the magnitude of each gate to source voltage (Vgs) decreases respective currents $i_1$, $i_2$, $i_4$ and $i_5$.

As transistor M2 becomes less saturated and conducts less current, the gate to source voltage (Vgs) of output transistor M5 increases. Output transistor M5 than conducts more current, due to the higher gate to source voltage (vgs), thereby causing current $i_5$ to be conducted through output transistor M5. Because bias transistor M5A is not saturated, current $i_5$ becomes smaller in value. Current $i_5$ conducts completely through output transistor M5, such that current $i_{out}$ is equal to zero. Thus, because output transistor M5 is saturated and $i_{out}$ is equal to zero, the node for the Vout signal is substantially grounded. Therefore, when the Vin inverting input signal is at a higher voltage than the Vin non-inverting input signal, the voltage of the Vout signal of comparator 500 is substantially at a zero level.

Figure 6A:
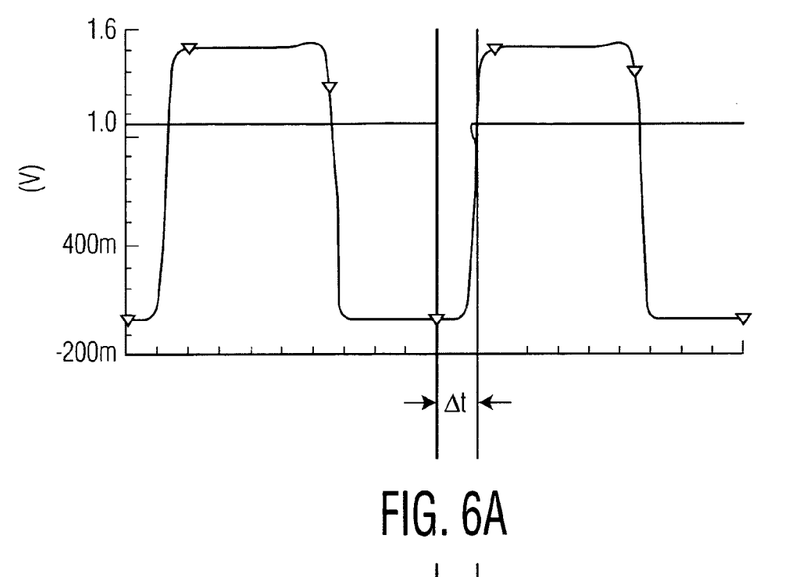
FIGS. 6A and 6B show an exemplary time delay between an input signal (FIG. 6B) and an output signal (FIG. 6A) of the high gain, high speed comparator shown in FIG. 1.
Figure 6B:
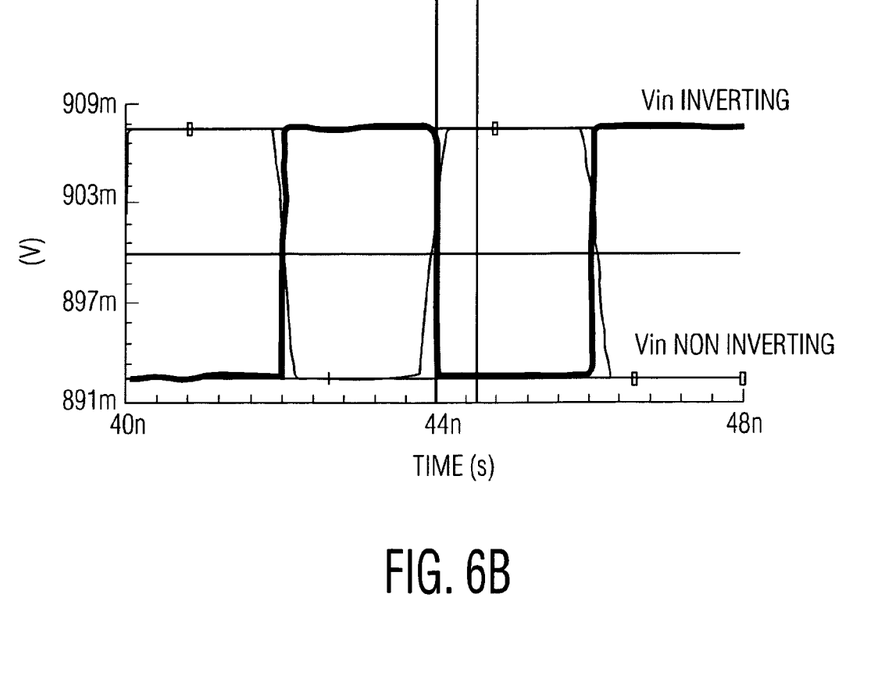

An example of the relationship between the input signal and the output signal of comparator 200 is shown in FIGS. 6A and 6B. It may be seen that comparator 200 achieves a very short propagation delay between the time of the input of the two comparison signals and the time of the output signal toggle. This delay is represented by Δt, and is of very short duration, such as approximately 0.5 ns.

Figure 7:
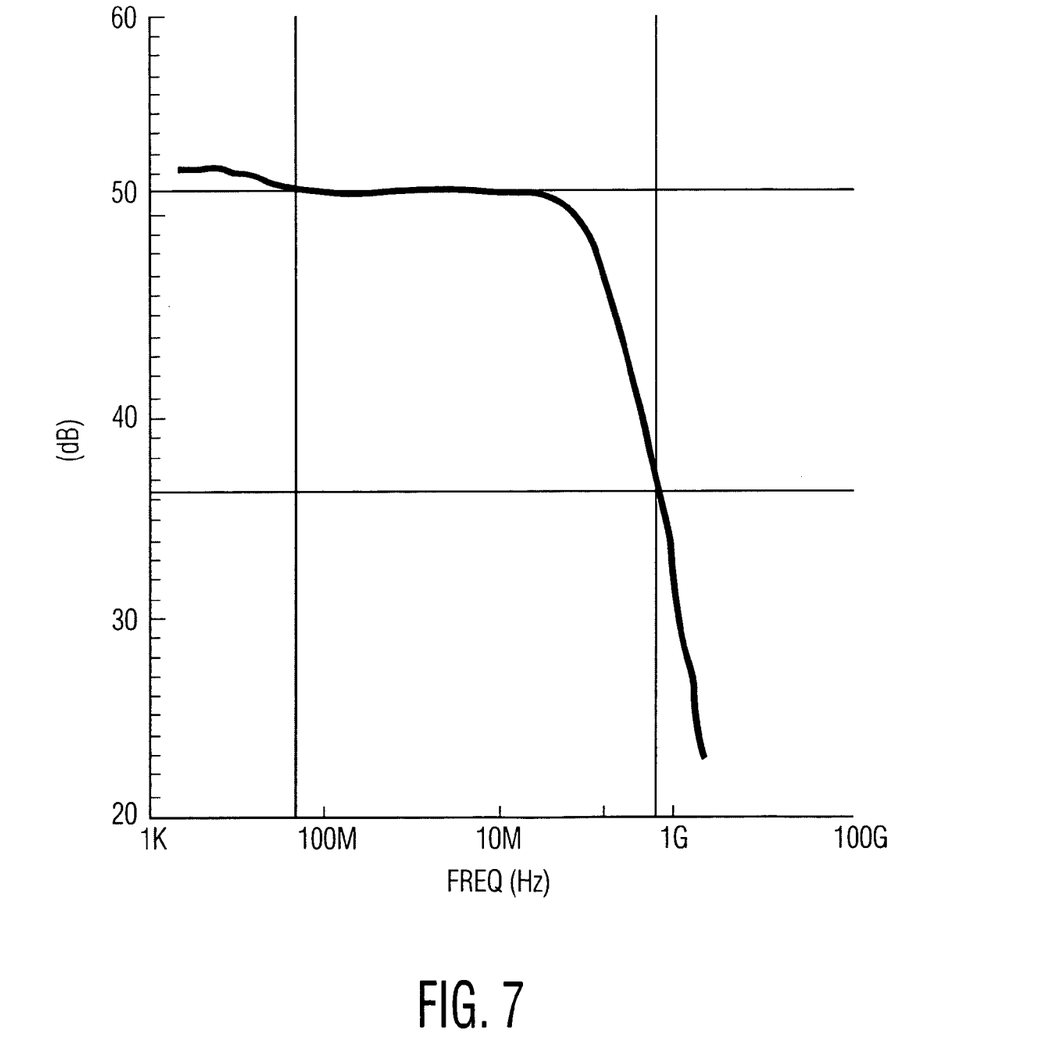
FIG. 7 is a logarithmic plot of gain versus frequency of the high gain, high speed comparator shown in FIG. 1.

FIG. 7 shows an exemplary logarithmic plot of gain versus frequency of comparator 200. As shown, comparator 200 achieves a high gain of approximately 50 dB, over a wide frequency range. This high gain is implemented with only two stages of amplification, thereby also achieving a very small propagation delay for the comparison.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A comparator comprising
a differential pair of transistors for (a) providing a first stage of amplification and (b) receiving inverting and non-inverting input signals,
a current-tail transistor coupled to the differential pair of transistors and configured to have a current flow that is substantially equal to the sum of the currents flowing in each of the differential pair of transistors,
an output transistor having a grounded node, the output transistor coupled to the differential pair of transistors for (a) providing a second stage of amplification and (b) transitioning an output signal from a low level state to a high level state, when the non-inverting input signal is higher than the inverting input signal, and
a feedback transistor coupled to the current-tail transistor for establishing the currents flowing in each of the differential pair of transistors,
wherein an output node comprising either a drain or a collector of one of the differential pair of transistors is directly connected to an input node of the current-tail transistor, and
an output node of the other one of the differential pair of transistors is connected to an input node of the output transistor.

2. The comparator of claim 1 wherein
input nodes of the differential pair of transistors receive the inverting and non-inverting input signals,
emitter or source nodes of the differential pair of transistors are connected to each other forming connected nodes, and
the connected nodes are coupled to an output node of the current-tail transistor.

3. The comparator of claim 2 wherein
a grounded node of the current-tail transistor and the grounded node of the output transistor are connected to each other.

4. The comparator of claim 3 wherein
respective output nodes of the differential pair of transistors, an output node of the output transistor and an output node of the feedback transistor are each coupled to a separate current generator.

5. The comparator of claim 4 wherein
each current generator includes a field effect transistor (FET) coupled to each respective output node, and
the FET is biased by a current flowing in the feedback transistor.

6. The comparator of claim 4 wherein
the current generators provide currents of i1 and i2 to the output nodes, respectively, of the differential pair of transistors, and
a current of i3 is provided to the output node of the current-tail transistor, the current i3 having substantially the following relationship:

$i1+i2=i3.$

7. The comparator of claim 6 wherein
the current generators provide a current of i5 to the output node of the output transistor, and
the current of i5 mirrors the current of i3.

8. The comparator of claim 5 wherein
an input node of the feedback transistor is connected to the input node of the current-tail transistor.

* * * * *

UNITED STATES PATENT AND TRADEMARK OFFICE
CERTIFICATE OF CORRECTION

PATENT NO. : 7,579,878 B2
APPLICATION NO. : 11/514121
DATED : August 25, 2009
INVENTOR(S) : Florin Pera It is certified that error appears in the above-identified patent and that said Letters Patent is hereby corrected as shown below:

At Column 1, line 20, reads "inverting input terminal, the is operational amplifier causes"; and should read "inverting input terminal, the operational amplifier causes"

Signed and Sealed this

Seventeenth Day of November, 2009

David J. Kappos
*Director of the United States Patent and Trademark Office*